United States Patent
Chung (10) Patent No.: US 7,380,152 B2
(45) Date of Patent: May 27, 2008

(54) DAISY CHAINED MULTI-DEVICE SYSTEM AND OPERATING METHOD

(75) Inventor: Hoe-Ju Chung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 446 days.

(21) Appl. No.: 11/165,340

(22) Filed: Jun. 24, 2005

(65) Prior Publication Data

US 2006/0181944 A1 Aug. 17, 2006

(30) Foreign Application Priority Data

Feb. 17, 2005 (KR) ............... 10-2005-0012975

(51) Int. Cl.
*G06F 1/00* (2006.01)

(52) U.S. Cl. ............ 713/500; 713/400; 713/401; 713/501; 713/502; 713/503; 713/600; 713/601; 714/25; 714/699; 714/715; 714/716; 714/717; 714/733; 714/738; 714/744; 714/731

(58) Field of Classification Search ........ 713/400–601; 714/25–46, 699–703, 715–745
See application file for complete search history.

(56) References Cited

U.S. PATENT DOCUMENTS

| | | | | |
|---|---|---|---|---|
| 6,003,118 A * | 12/1999 | Chen ................ | 711/167 |
| 6,317,352 B1 * | 11/2001 | Halbert et al. ........ | 365/52 |
| 6,378,018 B1 * | 4/2002 | Tsern et al. ............ | 710/313 |
| 6,590,781 B2 * | 7/2003 | Kollipara et al. ....... | 361/760 |
| 6,625,687 B1 * | 9/2003 | Halbert et al. ......... | 711/105 |
| 6,643,787 B1 * | 11/2003 | Zerbe et al. ........... | 713/400 |
| 6,839,785 B2 * | 1/2005 | Massie .................. | 710/300 |
| 6,912,680 B1 * | 6/2005 | Keeth ................... | 714/736 |
| 6,996,749 B1 * | 2/2006 | Bains et al. ............ | 714/42 |
| 7,027,307 B2 * | 4/2006 | Kollipara et al. ....... | 361/760 |
| 7,130,958 B2 * | 10/2006 | Chou et al. ........... | 711/103 |
| 7,155,627 B2 * | 12/2006 | Matsui ................. | 713/401 |
| 2002/0188781 A1 | 12/2002 | Schoch et al. | |
| 2005/0149774 A1 * | 7/2005 | Jeddeloh et al. ....... | 713/500 |
| 2005/0213611 A1 * | 9/2005 | James ................... | 370/503 |
| 2005/0283681 A1 * | 12/2005 | Jeddeloh .............. | 714/42 |
| 2006/0041730 A1 * | 2/2006 | Larson ................. | 711/167 |
| 2006/0047899 A1 * | 3/2006 | Ilda et al. ............... | 711/113 |
| 2006/0047990 A1 * | 3/2006 | James et al. ........... | 713/400 |
| 2006/0095646 A1 * | 5/2006 | Gower et al. .......... | 711/100 |
| 2006/0095701 A1 * | 5/2006 | Gower et al. .......... | 711/167 |
| 2006/0117233 A1 * | 6/2006 | Cowell et al. .......... | 714/724 |

FOREIGN PATENT DOCUMENTS

JP 11-175465 7/1999

\* cited by examiner

*Primary Examiner*—James K. Trujillo
*Assistant Examiner*—James F Sugent
(74) *Attorney, Agent, or Firm*—Volentine & Whitt, PLLC (57) ABSTRACT

A multi-device system having a daisy chain system bus structure and related method of operation are disclosed. A reference signal having a defined oscillation period is communicated around the daisy chain bus structure. Total signal transmission time around the daisy chain bus structure as well as signal transmission time to each one of a plurality of client devices connected to a host device by the daisy chain bus structure may be readily determined.

19 Claims, 7 Drawing Sheets

DAISY CHAINED MULTI-DEVICE SYSTEM AND OPERATING METHOD

BACKGROUND OF THE INVENTION

1. Field of the Invention

Embodiments of the invention relate generally to multi-device systems and related operating methods. A claim of priority is made to Korean Patent Application No. 2005-0012975 filed Feb. 17, 2005, the subject matter of which is hereby incorporated by reference.

2. Description of the Related Art

Many multi-device systems are characterized by a central host device and multiple client devices. The client devices are often sequentially controlled by control signals (or control data) provided by the host device. Given more than a trivial number of connected client devices, some estimation of a data transmission delay time for control signals between the host device and client devices is necessary.

In a conventional multi-device system, a data transmission delay time between the host and client devices is generally estimated using processes that involve repetitive experiments and/or repeated physical measurements. Thus, where conventional multi-device systems include a great number or complex configuration of client devices, or where complicated circuits are used to connect devices with the multi-device systems, the accurate calculation of a characteristic delay time using processes involving repetitive experiments and repeated measurements becomes very problematic. Indeed, experimental and/or measurement protocols often become very complicated and unwieldy.

SUMMARY OF THE INVENTION

Embodiments of the invention provide a multi-device system adapted to an accurate estimation or calculation of data signal transmission delay times using a relatively simple system bus structure and related circuits as well as a related calculation protocol.

In accordance with one aspect of the invention, a multi-device system is provided which comprises; a host device adapted to transmit data signal from an output terminal and receive the data signal through an input terminal, the host device providing a feedback signal from its input terminal to its output terminal, and wherein the host device comprises an oscillator generating a reference signal having a regular period from the feedback signal and providing the reference signal at the output terminal, a plurality of first through N-th client devices, each one comprising a drive input terminal, a drive output terminal, a response input terminal, and a response output terminal, a system drive bus comprising a plurality of first through N-th drive bus sections, wherein the first drive bus section connects the host device output terminal to a drive input terminal of the first client device, and wherein an i-th drive bus section connects a drive output terminal of an (i-th–1) client device to a drive input terminal of the i-th client device, where i-th varies from second to N-th, wherein "i" varies from 2 to N, a system response bus comprising a plurality of first through N-th response bus sections, wherein a first response bus section connects the host device input terminal to a response output terminal of the first client device, and wherein an i-th response bus section connects a response input terminal of the (i-th–1) client device to a response output terminal of the i-th client device, and a chain bus adapted to connect a drive input terminal of the N-th client device to a response input terminal of the N-th client device.

In a related aspect, at least one of the plurality of first through N-th client devices further comprises a frequency multiplier adapted to multiply the reference signal by a value "K" and output a multiplied reference signal.

In yet another related aspect, the value "K" is externally programmed into the at least one of the plurality of first through N-th client devices.

In still another related aspect, the reference signal comprises a data signal communicated between the drive input terminal and the drive output terminal of the at least one of the plurality of first through N-th client devices. Alternatively, the reference signal comprises a data signal communicated between the response input terminal and the response output terminal of the at least one of the plurality of first through N-th client devices.

In another related aspect, the host device further comprises; an oscillator imparting an oscillation period (tOSC) to the feedback signal and providing a predetermined buffering delay time (tBUF) to generate the reference signal, and wherein each one of the drive bus sections and response bus sections is characterized by a predetermined flight delay time (tFLT), such that the oscillation period is defined by tOSC=2*(2N+1)*(tBUF+tFLT).

In yet another related aspect, a total transmission delay (tDi) from the output terminal of host device through a daisy chain structure formed by the combination of system drive bus, system response bus, and chain bus to the input terminal of the host device mat be characterized by tDi=i*tOSC/(2*(2N+1)).

In still another related aspect, each one of the plurality of first through N-th client devices further comprises; a drive input buffer buffering the reference signal received as a drive input data signal the drive input terminal and outputting a buffered reference signal, and a drive output buffer buffering the buffered reference signal received from the drive input buffer and providing this signal at the drive output terminal. In such a system, the frequency multiplier receives the buffered reference signal from the drive input buffer.

In still another related aspect, each one of the plurality of first through N-th client devices further comprises; a response input buffer buffering the reference signal received as a response input data signal at the response input terminal and outputting a buffered reference signal, and a response output buffer buffering the buffered reference signal received from the response input buffer and providing this signal at the response output terminal. In such a system, the frequency multiplier receives the buffered reference signal from the drive input buffer.

In a related aspect, each one of the plurality of first through N-th client devices comprises a memory module including one or more memory devices capable of being independently addressed and operated. In a still more specific aspect, the memory module comprises a Dual In-Line Memory Module (DIMM).

In yet another aspect, each one of the plurality of first through N-th client devices comprises a reference clock (RCLK) having a period (tRCLK) defined by tOSC divided by K, and wherein the system is adapted to calculate a number of delay clock cycles (tCi) related to a data signal transmission delay between the host device and an i-th client device defined by tCi=tDi divided by tRCLK.

In another aspect, the invention provides a method of operating a multi-device system like any one of the ones summarized above. The method comprises; installing the chain bus, driving a reference signal from the host device onto the daisy chain bus structure, in the host device, identifying an oscillation period (tOSC) for the reference signal, and calculating a total transmission delay time (tDi) around the daisy chain bus structure using an equation $tDi=i*tOSC/(2*(2N+1))$.

In a related aspect, an i-th client device in the plurality of N client devices, where "i" ranging from 2 to N, comprises a frequency multiplier, and the method further comprises receiving the reference signal in the i-th client device and multiplying the received reference signal by a value K in the frequency multiplier, and calculating a number of delay clock cycles (tCi) defining a delay time for data signals communicated from the host device to the i-th client device according to the equation $tCi=i*K/(2*(2N+1))$.

The value K may, optionally, be externally programmed into the frequency multiplier.

In yet another aspect, the invention provides a multi-device system comprising; a host device adapted to transmit a reference signal from an output terminal and receive the reference signal through an input terminal, the reference signal being derived from a feedback signal connecting the host device input terminal and output terminal, wherein the host device comprises an oscillator generating the reference signal having a regular period (tOSC) from the feedback signal, a plurality of first through N-th client devices, each one comprising a drive input terminal and a drive output terminal, a daisy chain system bus comprising a plurality of first through N-th bus sections respectively connecting successive client devices in the plurality of first through N-th client devices between the host device input terminal and the host device output terminal, wherein the total transmission delay (tDi) around the daisy chain system bus is defined by $tDi=i*tOSC/(2*(2N+1))$, wherein $tOSC=2*(2N+1)*(tBUF+tFLT)$, and wherein (tBUF is a predetermined delay introduced by the oscillator and (tFLT) is a signal transmission delay for each system bus section.

BRIEF DESCRIPTION OF THE DRAWINGS

Hereafter, several exemplary embodiments of the invention will be described in relation to the accompanying drawings. Like numerals in the drawings are used to designate the same or similar components, steps, features, and/or aspects related to the embodiments. In the drawings.

DESCRIPTION OF THE EXEMPLARY EMBODIMENTS

The exemplary embodiments that follow are teaching examples. They are best understood in the context of the accompanying drawings. Well-known, conventional detail related to the exemplary embodiments of the invention has been omitted from the description that follows for the sake of clarity.

Prior to describing an exemplary system, a typical client device will first be described. The selection of a specific typical client device as well as exemplary connection elements provides a clear descriptive predicate for the exemplary system description that follows. It must be emphasized that these selections are merely presently preferred example. The invention is not limited to only these teaching examples but is defined by the claims that follow.

A Dual In-Line Memory Module (DIMM) is selected as a typical client device susceptible to incorporation within embodiments of the invention. DIMMs are generally small Printed Circuit Boards (PCBs) on which a plurality of discrete element and devices, such as integrated circuits, may be mounted. A DIMM typically includes connection lead wires accessible through electrical connectors integral to the PCB. Further, each DIMM may be operatively inserted into a small socket connector coupled to a larger PCB, generally termed a "motherboard." A plurality of DIMMS are typically and directly connected to a common host device through multiple connection line, drop-connections that usually traverse the socket connector, thereby coupling the multiple connection lead wires in the DIMM to one or more system buses associated with the host device. These multi-drop connections may take many different physical forms, but generally connect a DIMM to one or more system buses through one or more connection terminals.

The one or more system buses allow communication of data, control signals, address signals, clock/timing signals, etc., (hereafter collectively or singularly referred to as "data signals") between the host device and the plurality of connected DIMMs. These various signals are often directed along one or more of the system buses between the discrete elements and/or integrated circuits mounted on respective DIMMs and the host device.

In one embodiment of the invention, the system buses comprises a system drive bus adapted to communicate data signals from the host device to a plurality client devices (e.g., multiple DIMMs), and a system response bus adapted to communicate data signals from the client devices to the host device. The drive bus and response bus may be implemented in separate signal lines and/or common (multiplexed) signal lines at the system designers discretion.

Figure 1:
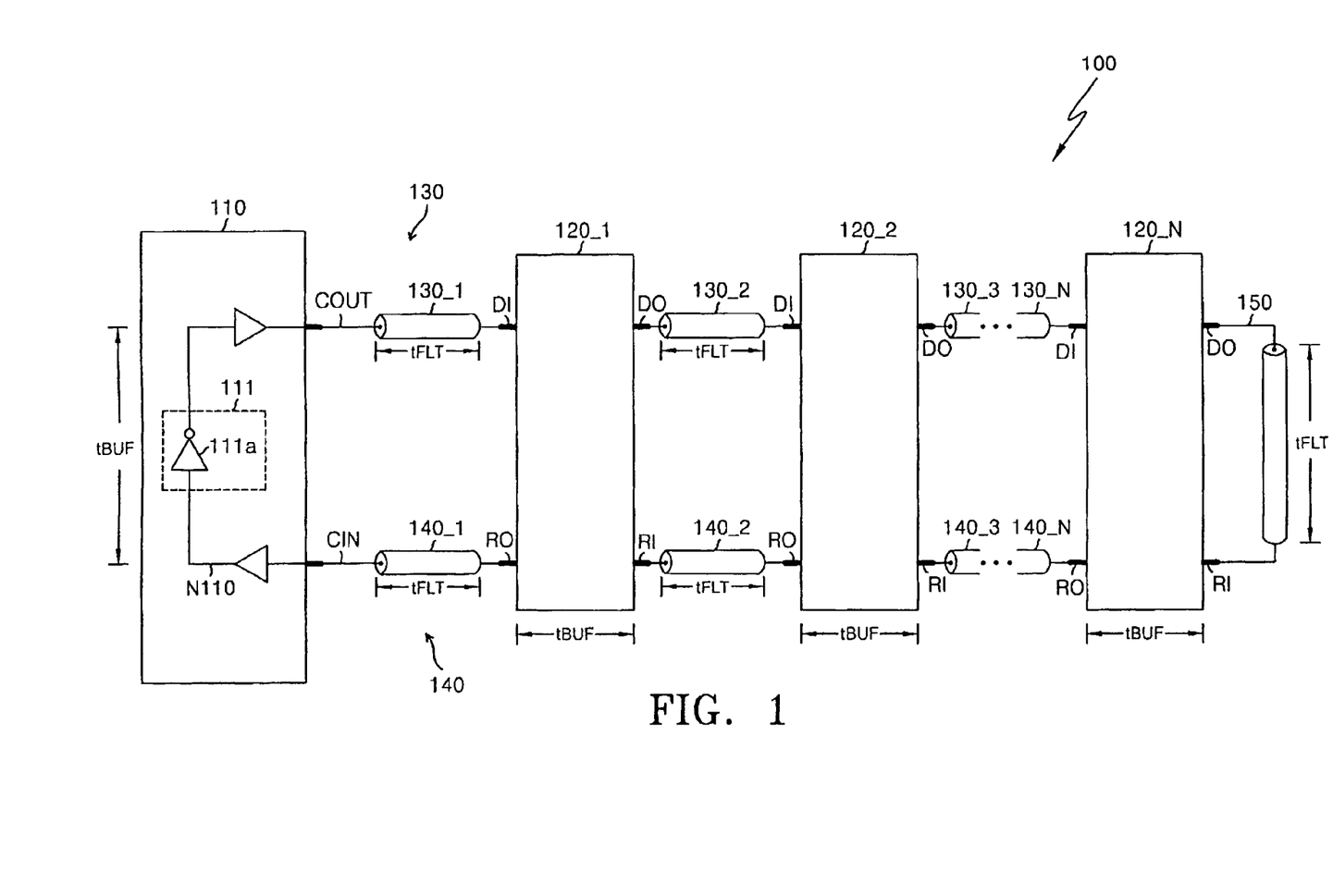
FIG. 1 is a view showing a multi-device system according to an embodiment of the present invention.

FIG. 1 illustrates an exemplary system layout for a multi-device system 100 according to one embodiment of the invention. Referring to FIG. 1, multi-device system 100 includes a host device 110, and a plurality of first through N-th client devices. In this context, "N" is deemed to be a natural number equal to or greater than 2. In the illustrated example, the plurality of first through N-th client devices is numbered 120_1 through 120_N. The multi-device system 100 further comprises a segmented system drive bus 130, a segmented system response bus 140, and a chain bus 150.

Host device 110 transmits data signals from an output terminal (COUT) and receives data signals through an input terminal (CIN). Of further note, host device 110 provides a feedback signal from input terminal (CIN) to output terminal (COUT).

In the illustrated example, host device 110 also comprises an oscillator 111 adapted to regulate (i.e., control) the oscillation frequency of a reference signal provided at the host device output terminal (COUT). This reference signal may be separately provided to the plurality of first through N-th client devices 120_1 to 120_N connected to host device 110 in a daisy chain structure, or it may be an oscillating reference modulation applied to one or more of the data signals.

In a related aspect, oscillator 111 may include an inverter 111a that inverts the feedback signal received from input terminal (CIN) and thereafter provided in inverted form to output terminal (COUT). Where this exemplary structure is incorporated in an embodiment of the invention, a transmission delay (hereafter referred to as "a buffering delay time (tBUF)", as between input terminal (CIN) and output terminal (COUT) of host device 110, may be provided for the feedback signal, said feedback signal having a logic state which is inverted by oscillator 111 through operation of inverter 111. That is, a calculated delay time between a high peak for one or more data signals received at input terminal (CIN) and a low peak for a corresponding feedback signal applied to output terminal (COUT) is defined by buffering delay time (tBUF). Naturally, the value of buffering delay time (tBUF) may be adjusted by the system designer in any number of conventional ways, including the selection or design of inverter 111.

Each one of the plurality of first through N-th client devices 120_1 to 120_N includes a drive input terminal (D1), a drive output terminal (DO), a response input terminal (R1) and a response output terminal (R0). Data signals originating from host device 110 and communicated via the system drive bus 130 are communicated in cascade to each one of the plurality of first through N-th client devices through a previous-device drive output terminal (DO) and then through a following the drive input terminal (D1).

Further, data signals are communicated in similar cascade via the system response bus 140 from a previous-device response output terminal (RO) and then through a following response input terminal (R1).

In one embodiment of the invention, the plurality of first through N-th client devices 120_1 to 120_N are memory modules each having one or more memory devices mounted thereon and each being capable of independent addressing and read/write operaiton.

In a related aspect, system drive system bus comprises first through N-th drive bus sections 130_1 to 130_N. In at least one embodiment, each drive bus section is separately implemented. In such a case, the drive bus sections may be designated as system buses between adjacent multi-drop connections. However, in other embodiments, the drive bus sections may be connected and integrated as part of one or more continuous bus structures.

However, physically implemented, an i-th drive bus section is said to connect a drive output terminal (D0) of an (i-th−1) client device to a drive input terminal (D1) of an i-th client device. In this regard, the term (i-th−1) denotes a prior client device in cascade and (i-th) denotes a current client device. Using this nomenclature, the value of "i" thus ranges from 2 to "N." Of further note, a first drive bus section 130_1 connects the output terminal (COUT) of host device 110 to the driving input terminal (DI) of the first client device 120_1.

In the illustrated embodiment, respective data signal transmission delay times (signal lag) for each one of the drive bus sections 130_1 to 130_N, that is, the respective delay time between each (i-th−1) client device output terminal (DO) and a following (i-th) client device drive input terminals (DI), are a function of data signal flight delay times (tFLT). In practice, respective bus section flight delay times are very close to one another.

The system response bus includes first through N-th response bus sections 140_1 to 140_N. In the illustrated embodiment, the response bus sections may be separately implemented, or provided as part of an integrated bus structure, as per the discussion above with reference to the system drive bus.

An i-th response bus section connects the response input terminal (RI) of an (i-th−1) client device to the response output terminal (RO) of an i-th client device. Further, the first response bus section 140_1 connects the input terminal (CIN) of host device 110 to the response output terminal RO of first client device 120_1.

In this embodiment, the delay time at each of the response bus sections 140_1 to 140_N, that is, the delay time between the response output terminal RO of an arbitrary client device and the response input terminal RI of a subsequent client device, is also implemented to be a flight delay time (tFLT), similar to the case of each respective drive bus section.

The chain bus 150 connects the drive output terminal (DO) and the response input terminal (RI) of the last (N-th) client device 120_N. In this embodiment, the delay time of chain bus 150, that is, the delay time between the drive output terminal (DO) and the response input terminal (RI) of the N-th client device 120_N is a function of the flight delay time (tFLT), similar to the case of each drive bus section and each response bus section.

As described above, the illustrated embodiment to the multi-device system according to the invention comprises host device 110 and the plurality of first through N-th client devices 120_1 to 120_N respectively connected in a daisy chain structure using system drive bus 130, system response bus, and chain buys 150. Additionally, an oscillating reference signal is communicated around the daisy chain structure using a selected or specifically provided feedback signal apparent a host device terminal N110.

In this case, the oscillation period (tOSC) for the feedback signal may be obtained by the following equation:

$$tOSC=2*(2N+1)*(tBUF+tFLT) \quad [1]$$

Further, where oscillation period (tOSC) is identified (e.g., measured), a transmission delay time (tDi) between host device 110 and each i-th client device 120_i may be calculated by the following equation:

$$tDi=i*tOSC/(2*(2N+1)) \quad [2]$$

Figure 2A:
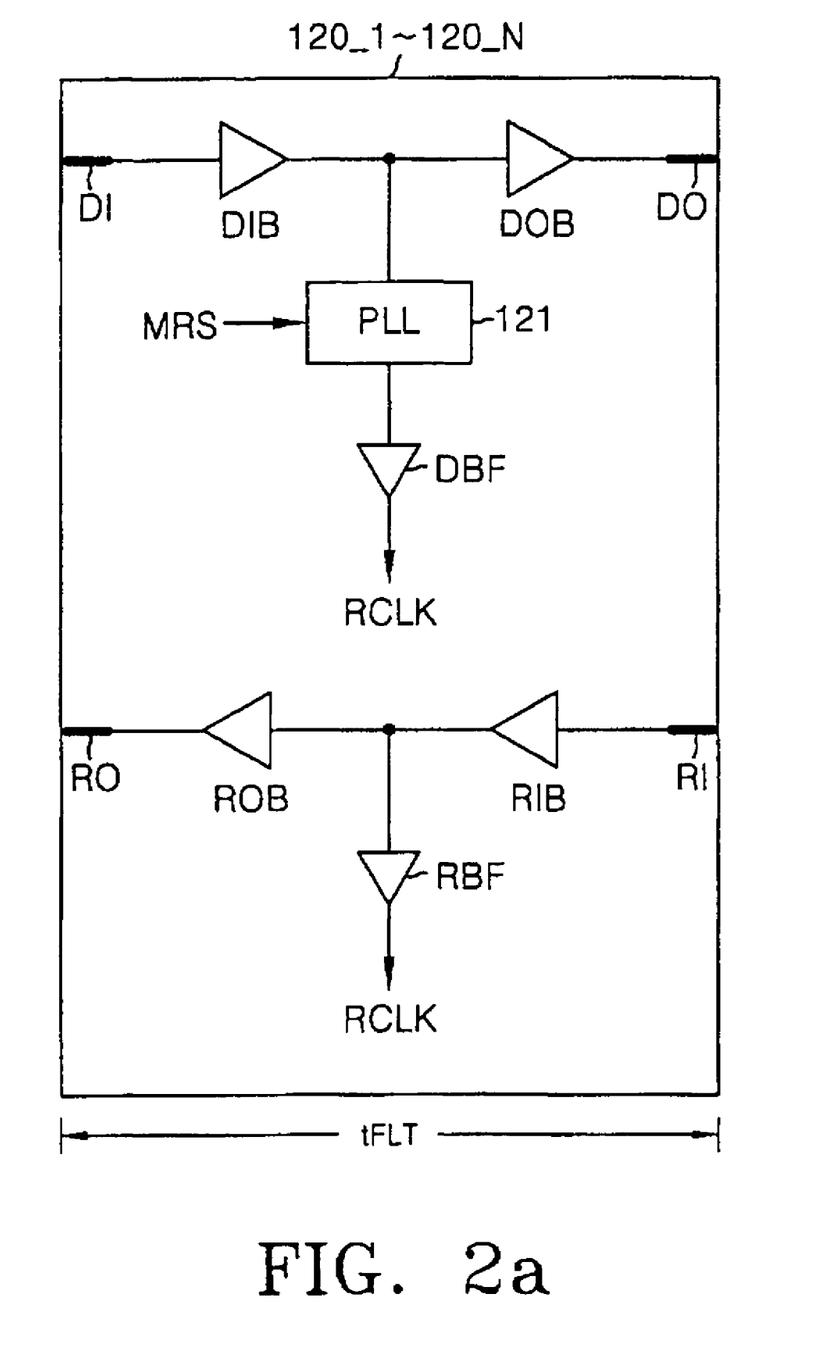
FIGS. 2a and 2b are views showing examples of a client device of FIG. 1.
Figure 2B:
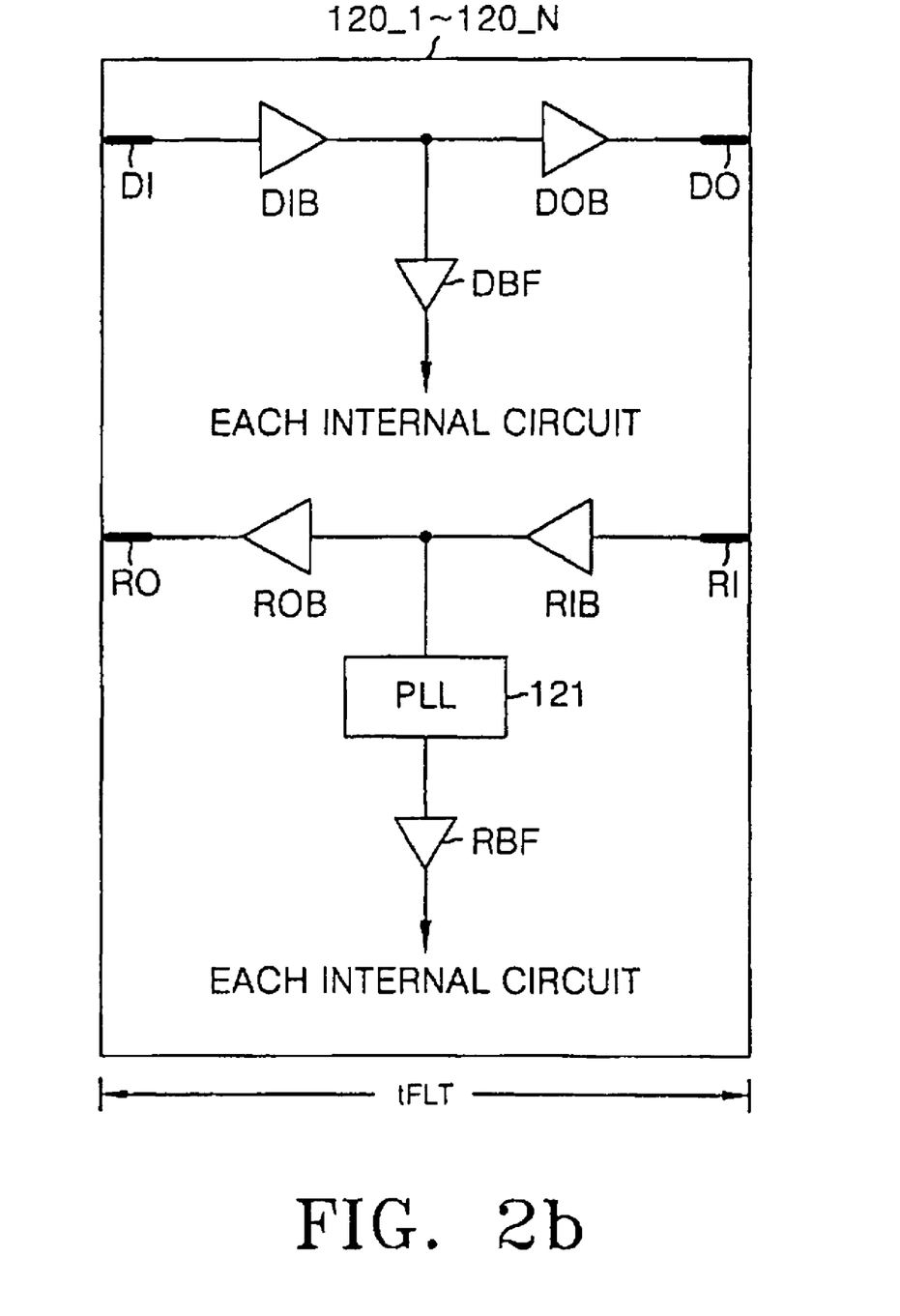

FIGS. 2a and 2b are partial circuit views further illustrating selected aspects of client devices 120_1 to 120_N of FIG. 1. Referring to FIGS. 2a and 2b, each of the client devices 120_1 to 120_N includes a drive input buffer (DIB), a drive output buffer (DOB), a response input buffer (RIB) and a response output buffer (ROB).

Drive input buffer (DIB) buffers a drive input data signal received from a corresponding drive input terminal (DI), and drive output buffer (DOB) buffers a drive output data signal received from the drive input buffer (DIB) and provides the buffered drive output data signal to the drive output terminal (DO).

Response input buffer (RIB) buffers an input response data signal received from the response input terminal (RI), and response output buffer (ROB) buffers an output response data signal received from response input buffer (RIB) and provides the buffered response output data signal to response output terminal (RO).

Preferably, at least one of the plurality of first through N-th client devices further comprises a frequency multiplier 121. As shown in FIG. 2a, frequency multiplier 121 may be implemented to multiply the frequency of a signal communicated between the drive input terminal (DI) and the drive output terminal (DO) by some value "K." Further, as shown in FIG. 2b, frequency multiplier 121 may be implemented to multiply the frequency of a signal communicated between the response input terminal (RI) and the response output terminal (RO) by some value "K." In one preferred embodiment, frequency multiplier 121 is implemented as a Phase Locked Loop (PLL) circuit of conventional design.

The multiplied signal output from frequency multiplier 121 may be used as a reference clock signal (RCLK) controlling one or more circuits internal to the constituent client device. The value of multiplier "K" may be externally programmed for each client device using, for example, a programmable Mode Register Set (MRS), or similar conventional technique.

With the foregoing structure in mind, a number of delay clock cycles (tCi) apparent at each one of the plurality of first through N-th client devices, including a frequency multiplier 121, may be easily estimated. In this case, the number of delay clock cycles (tCi) is equal to the maximum number of cycles for reference clock signal (RCLK) that can be generated during the period in while a selected or specifically provided data signal generated at host device 110 finally reaches each respective client device.

In some additional detail, the period (tRCLK) of the reference clock signal (RCLK) may be expressed by the following equation:

$$tRCLK = tOSC/K \quad [3]$$

With this definition, the number of delay clock cycles (tCi) is equal to a value obtained by dividing the transmission delay time (tDi) from host device 110 and an i-th client device by the period of the reference clock signal (tRCLK).

Therefore, the number of delay clock cycles (tCi) may be calculated by the following equation:

$$\begin{aligned} tCi &= tDi/tRCLK \quad [4] \\ &= \{i*tOSC/(2*(2N+1))\}/\{tOSC/K\} \\ &= i*K/(2*(N+1)) \end{aligned}$$

In this case, i, K and N can be easily determined, so that the number of delay clock cycles (tCi) for the i-th client device can be easily estimated.

Figure 3:
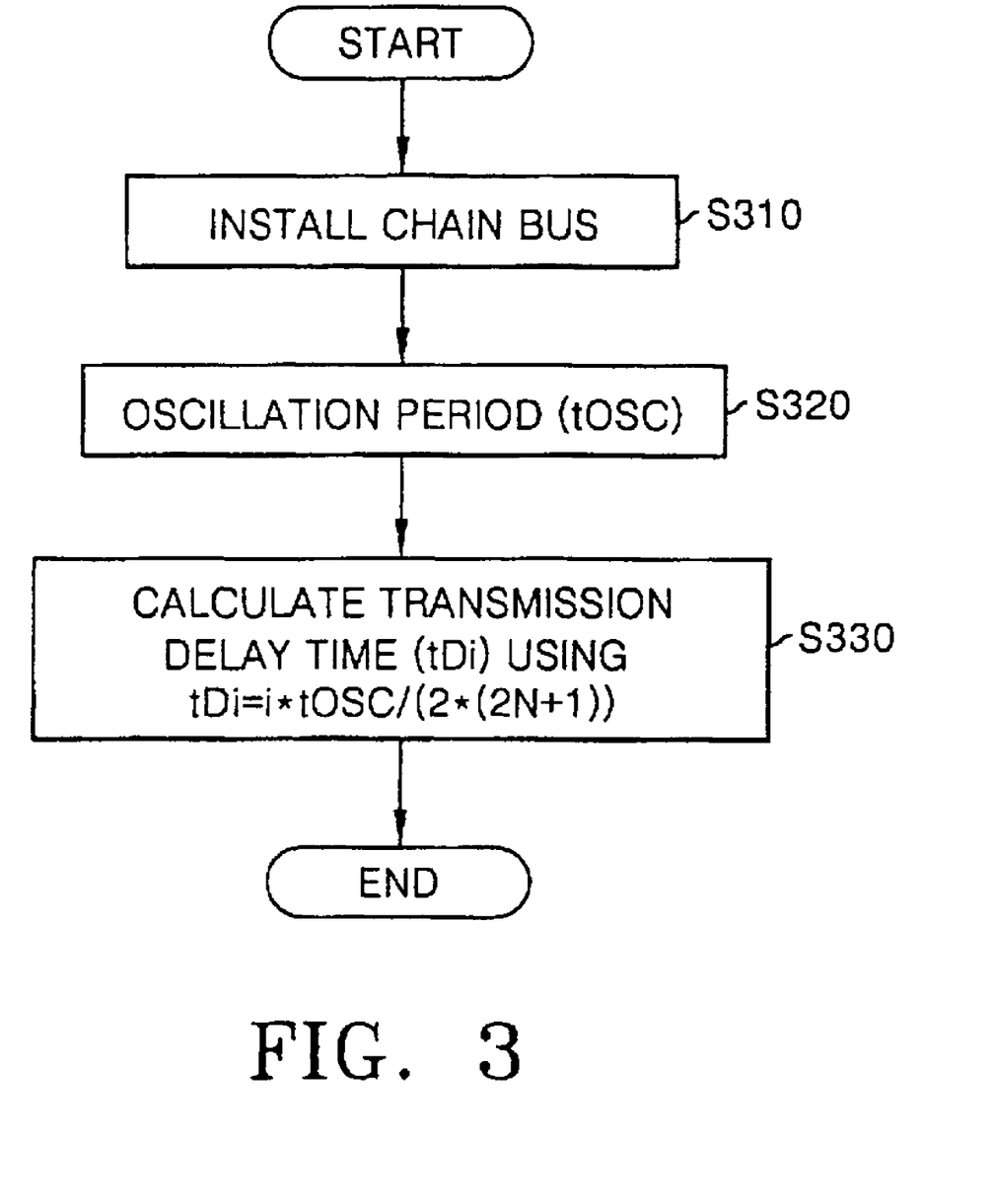
FIG. 3 is a flowchart of a method of operating the multi-device system of FIG. 1, which shows a method of obtaining a transmission delay time tDi between a host device and an i-th client device.

FIG. 3 is an exemplary flowchart illustrating a method of operating a multi-device system like the one shown in FIG. 1. This exemplary method shows one way in which a transmission delay time (tDi) between the host device and an i-th client device may be obtained. First, chain bus 150 is installed between the drive output terminal (DO) and the response input terminal (RI) of an N-th client device to complete a daisy chain structure connecting host device 110 and the plurality of first through N-th client devices (S310). Then, host device 110 identifies the oscillation period (tOSC) of the feedback signal (S320). Finally, host device 110 calculates a transmission delay time (tDi) between host device 110 and an i-th client device 120_i using the equation [2] above.

Figure 4:
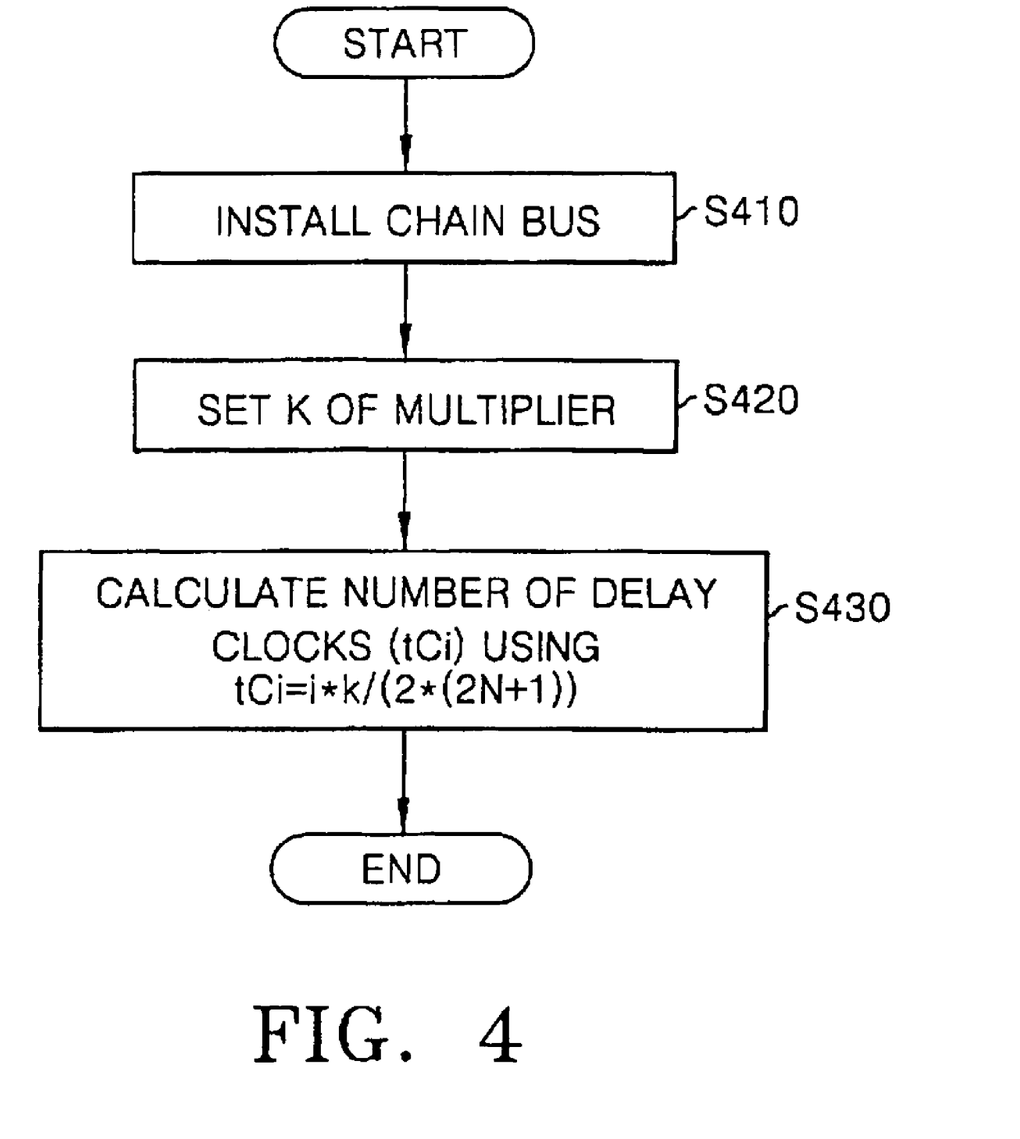
FIG. 4 is a flowchart of another method of operating the multi-device system of FIG. 1, which shows a method of obtaining the number of delay clocks tCi of an i-th client device.

FIG. 4 is a flowchart illustrating another method of operating the multi-device system of FIG. 1, which shows a method of obtaining the number of delay clocks (tCi) for an i-th client device. With reference to FIG. 4, the method of obtaining the number of delay clocks tCi is summarized as follows.

Like above chain bus 150 is installed between the drive output terminal (DO) and the response input terminal (RI) of the N-th client device so as to arrange host device 110 and the plurality of first through N-th client devices in a daisy chain structure (S410). Then, the i-th client device is configured to receive and multiply by some selected value K a data signal obtained from either the system drive bus or the system response bus, thus generating the reference clock signal (RCLK) (S420). Finally, host device 110 calculates the number of delay clocks (tCi) of the i-th client device using equation [4] above (S430).

In either of the foregoing exemplary methods, which are described in the context of the foregoing multi-device system, an accurate transmission delay time, as between host device 110 and any one of the plurality of first through N-th client devices $120\_1$ to $120\_N$ may be obtained using a simple circuit adaptations. Alternatively, the number of delay clock cycles may be easily estimated.

Figure 5:
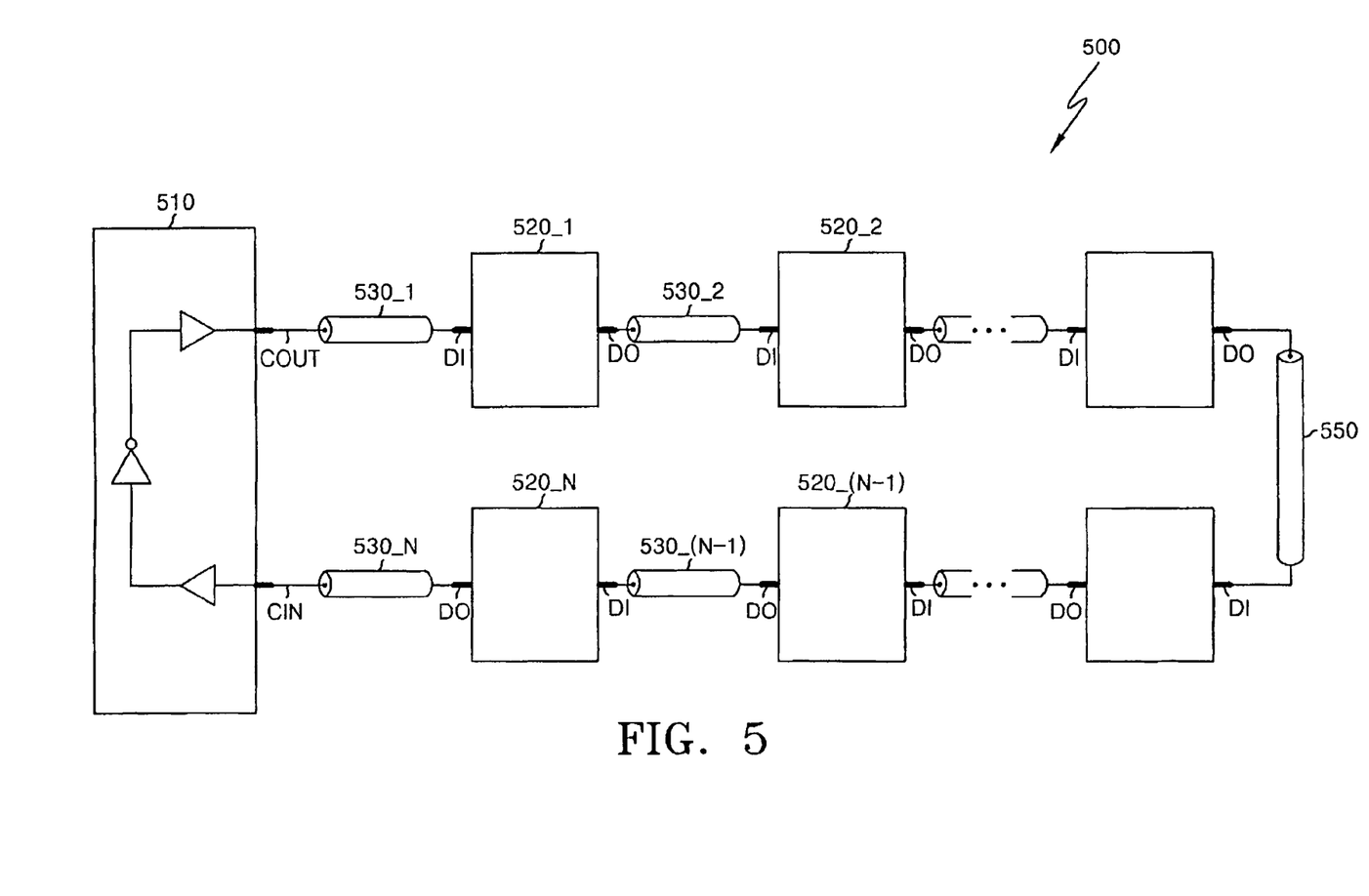
FIG. 5 is a view showing a multi-device system according to another embodiment of the present invention.
Figure 6:
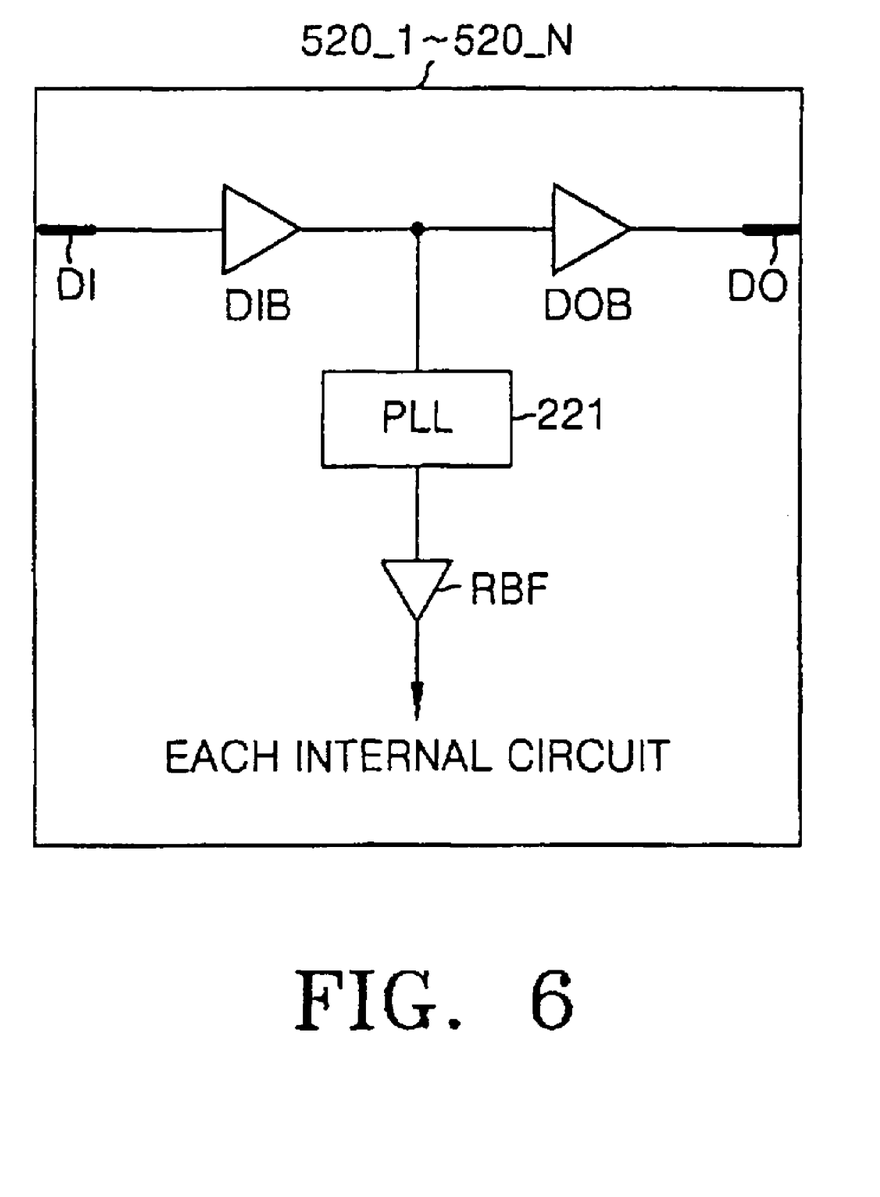
FIG. 6 is a view showing an example of a client device of FIG. 5.

FIG. 5 is a general view showing a multi-device system 500 according to another embodiment of the invention, and FIG. 6 is a view further illustrating one of the client devices 520_1 to 520_N shown in FIG. 5. The multi-device system 500 of FIGS. 5 and 6 is departs from the multi-device system 100 of FIG. 1 in that a plurality of first through N-th client devices are arranged along a single system bus structure comprising system bus segments 530_1 through 530-N and chain bus segment 550 is arranged between respective output terminals (DO) and input terminals (DI) between host device output terminal (COUT) and host device input terminal (CIN).

In the multi-device system 500 of FIG. 5, a transmission delay time (tDi) between the host device 510 and an i-th client device 520_i may be calculated by the following equation:

$$tDi = i*tOSC/(2*(2N+1)) \quad [5]$$

Then, the number of delay clocks (tCi) is equal to a value obtained by dividing the transmission delay time (tDi) from host device 510 to the i-th client device 120_i by the period (tRCLK) of the reference clock signal (RCLK).

Therefore, the number of delay clock cycles (tCi) may be calculated by the following equation:

$$\begin{aligned} tCi &= tDi/tRCLK \quad [6] \\ &= \{i*tOSC/(2*(2N+1))\}/\{tOSC/K\} \\ &= i*K/(2*(N+1)) \end{aligned}$$

A reference signal buffer (RBF) is provided to receive and hold the output of frequency multiplier shown in FIG. 6.

The rest of the construction and operation of the multi-device system 500 of FIG. 5 can be easily understood by those skilled in the art with reference to the description related to the multi-device system 100 of FIG. 1. Therefore, a detailed description of analogous aspects of the current embodiment is omitted.

Those skilled in the art will also appreciate that various modifications, additions and substitutions are possible within the context of the foregoing teaching embodiments without departing from the scope of the invention as defined in the accompanying claims.

As described above, embodiments of the invention provides a multi-device system in which a daisy chain structure communicates a reference signal having oscillating frequency. The daisy chain structure may be formed by connecting a host device and a plurality of client devices around a single system bus or across multiple system buses. In such a multi-device system and related method of operation, only the oscillation period of reference signal need be measured in order to calculate a data transmission delay time between the host device and the client devices. Thus, the data transmission delay time between the host device and any one of the plurality of client devices may be accurately determined using simple circuit constructions and a simple calculation protocol. Alternatively or additionally, a corresponding number of delay clock cycle associated with each one of the plurality of client device may be easily estimated.

What is claimed is:

1. A multi-device system, comprising:
    a host device adapted to provide a data signal and a reference signal at an output terminal and receive a feedback signal at an input terminal, and comprising an oscillator generating the reference signal by imparting an oscillation period (tOSC) and a predetermined buffering delay time (tBUF) to the feedback signal;
    a plurality of first through N-th client devices, each comprising a drive input terminal, a drive output terminal, a response input terminal, and a response output terminal;
    a system drive bus comprising a plurality of first through N-th drive bus sections, wherein the first drive bus section connects the host device output terminal to a drive input terminal of the first client device, and wherein an i-th drive bus section connects a drive output terminal of an (i-th-1) client device to a drive input terminal of the i-th client device, where wherein i varies from 2 to N;
    a system response bus comprising a plurality of first through N-th response bus sections, wherein a first response bus section connects the host device input terminal to a response output terminal of the first client device, and wherein an i-th response bus section connects a response input terminal of the (i-th-1) client device to a response output terminal of the i-th client device; and
    a chain bus adapted to connect a drive output terminal of the N-th client device to a response input terminal of the N-th client device,
    wherein each one of the drive bus sections and response bus sections is characterized by a predetermined flight delay time (tFLT), such that the oscillation period tOSC=2*(2N+1)*(tBUF+tFLT).

2. The system of claim 1, wherein at least one of the plurality of first through N-th client devices further comprises:
    a frequency multiplier adapted to multiply the reference signal by a value "K" and output a multiplied reference signal.

3. The system of claim 2, wherein the value "K" is externally programmed into the at least one of the plurality of first through N-th client devices.

4. The system of claim 2, wherein the reference signal comprises a data signal communicated between the drive input terminal and the drive output terminal of the at least one of the plurality of first through N-th client devices.

5. The system according to claim 4, wherein each one of the plurality of first through N-th client devices further comprises:
    a drive input buffer buffering the reference signal received as a drive input data signal the drive input terminal and outputting a buffered reference signal; and,
    a drive output buffer buffering the buffered reference signal received from the drive input buffer and providing this signal at the drive output terminal.

6. The system of claim 5 wherein the frequency multiplier receives the buffered reference signal from the drive input buffer.

7. The system of claim 6 wherein the frequency multiplier receives the buffered reference signal from the drive input buffer.

8. The system of claim 2, wherein the reference signal comprises a data signal communicated between the response input terminal and the response output terminal of the at least one of the plurality of first through N-th client devices.

9. The system according to claim 8, wherein each one of the plurality of first through N-th client devices further comprises:
    a response input buffer buffering the reference signal received as a response input data signal at the response input terminal and outputting a buffered reference signal; and,
    a response output buffer buffering the buffered reference signal received from the response input buffer and providing this signal at the response output terminal.

10. The system of claim 1, wherein a total transmission delay (tDi) from the output terminal of host device through a daisy chain structure formed by the combination of system drive bus, system response bus, and chain bus to the input terminal of the host device is characterized by $$tDi = *tOSC/(2*(2N+1)).$$

11. The system of claim 10, wherein each one of the plurality of first through N-th client devices comprises a reference clock (RCLK) having a period (tRCLK) defined by tOSC divided by K; and,
    wherein the system is adapted to calculate a number of delay clock cycles (tCi) related to a data signal transmission delay between the host device and an i-th client device defined by tCi=tDi divided by tRCLK.

12. The system of claim 1, wherein each one of the plurality of first through N-th client devices comprises a memory module including one or more memory devices capable of being independently addressed and operated.

13. The system of claim 12, wherein the memory module comprises a Dual In-Line Memory Module (DIMM).

14. A method of operating a multi-device system, the multi-device system comprising a host device, a plurality of N client devices, and a daisy chain bus structure connecting the host device with the plurality of N client devices, wherein the daisy chain bus structure comprises a segmented system drive bus sequentially connecting the plurality of N client devices in a forward direction, a segmented system response bus sequentially connecting the plurality of N client devices in a reverse direction, and a chain bus connect the system drive bus and system response bus,
    the method comprising:
        installing the chain bus;
        in the host device, receiving a feedback signal from the system response bus, generating a reference signal by imparting an oscillation period (tOSC) and a predetermined buffering delay time (tBUF) to the feedback signal, and providing the reference signal to the system drive bus, wherein each segment of the system drive bus and the response bus is characterized by a predetermined flight delay time (tFLT), such that the oscillation period is equal to 2*(2N+1)*(tBUF+tFLT); and
    calculating a total transmission delay time (tDi) around the daisy chain bus structure using an equation $tDi = i*tOSC/(2*(2N+1))$, where "i" ranges from 2 to N and represents the i-th client device in the plurality of N client devices.

15. The method of claim 14, wherein the i-th client comprises a frequency multiplier, and wherein the method further comprises:
   receiving the reference signal in the i-th client device and multiplying the received reference signal by a value K in the frequency multiplier; and,
   calculating a number of delay clock cycles (tCi) defining a delay time for data signals communicated from the host device to the i-th client device according to the equation $tCi = i*K/(2*(2N+1))$.

16. The method of claim 15, further comprising programming value K in the frequency multiplier.

17. The method of claim 16, wherein the plurality of N client devices each comprises a memory module including one or more memory devices capable of being independently addressed and operated.

18. The method of claim 17, wherein the memory module comprises a Dual In-Line Memory Module (DIMM).

19. A multi-device system, comprising:
   a host device adapted to transmit a reference signal from an output terminal and receive a feedback signal through an input terminal, wherein the host device comprises an oscillator generating the reference signal having a regular period (tOSC) from the feedback signal;
   a plurality of first through N-th client devices, each one comprising a drive input terminal and a drive output terminal;
   a daisy chain system bus comprising a plurality of first through N-th bus sections respectively connecting successive client devices in the plurality of first through N-th client devices between the host device input terminal and the host device output terminal;
   wherein the total transmission delay (tDi) around the daisy chain system bus is defined by $tDi = i*tOSC/(2*(2N+1))$, where "i" ranges from 2 to N and represents the i-th client device in the plurality of N client devices, and $tOSC = 2*(2N+1)*(tBUF+tFLT)$, and wherein (tBUF) is a predetermined delay introduced by the oscillator and (tFLT) is a signal transmission delay for each system bus section.

* * * * *